US011258451B2

(12) United States Patent
Buckel et al.

(10) Patent No.: US 11,258,451 B2
(45) Date of Patent: Feb. 22, 2022

(54) APPARATUS AND METHOD FOR GENERATING AN OSCILLATION SIGNAL, MOBILE COMMUNICATION SYSTEMS AND MOBILE DEVICE

(71) Applicant: Intel Corporation, Santa Clara, CA (US)

(72) Inventors: Tobias Buckel, Linz (AT); Peter Preyler, Weyer (AT); Thomas Mayer, Linz (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/059,478

(22) PCT Filed: Jul. 26, 2019

(86) PCT No.: PCT/US2019/043547
§ 371 (c)(1),
(2) Date: Nov. 30, 2020

(87) PCT Pub. No.: WO2020/046503
PCT Pub. Date: Mar. 5, 2020

(65) Prior Publication Data
US 2021/0218406 A1    Jul. 15, 2021

(30) Foreign Application Priority Data

Aug. 31, 2018  (DE) .......................... 102018121318.2

(51) Int. Cl.
*H03D 3/24*     (2006.01)
*H03L 7/099*    (2006.01)
(Continued)

(52) U.S. Cl.
CPC ............ *H03L 7/0995* (2013.01); *H03L 7/093* (2013.01); *H04B 1/40* (2013.01)

(58) Field of Classification Search
CPC ......... H03L 7/0995; H03L 7/093; H04B 1/40; H04B 1/18; H03C 3/0975; H04N 5/455
(Continued)

(56) References Cited

U.S. PATENT DOCUMENTS 6,640,311 B1   10/2003  Knowles
7,626,462 B1   12/2009  Hietala et al.
(Continued)

FOREIGN PATENT DOCUMENTS

JP    2011-139545 A    7/2011
JP    2012-060585 A    3/2012

OTHER PUBLICATIONS

B. Bahr et al.: "32GHz Resonant-Fin Transistors in 14nm FinFET Technology," ISSCC Dig. Tech. Papers, pp. 348-350, Feb. 2018.

*Primary Examiner* — Phuong Phu
(74) *Attorney, Agent, or Firm* — 2SPL Patent Attorneys PartG mbB; Kieran O'Leary

(57) ABSTRACT

An apparatus for generating an oscillation signal is provided. The apparatus includes an input configured to receive a first reference oscillation signal, and a phase detector circuit configured to determine a phase drift of the first reference oscillation signal with respect to a second reference oscillation signal. Further, the apparatus includes a phase shifter circuit configured to generate the oscillation signal based on the first reference oscillation signal and a control signal. The control signal is based on the phase drift and a frequency control signal comprising control data for the phase shifter circuit for adjusting a frequency of the oscillation signal to a desired frequency.

21 Claims, 5 Drawing Sheets

(51) Int. Cl.
*H03L 7/093* (2006.01)
*H04B 1/40* (2015.01)

(58) Field of Classification Search
USPC ................................. 375/371, 373, 375, 376
See application file for complete search history.

(56) References Cited

U.S. PATENT DOCUMENTS

| | | | | |
|---|---|---|---|---|
| 2007/0105504 | A1* | 5/2007 | Vorenkamp | H04N 5/455 455/73 |
| 2010/0093293 | A1* | 4/2010 | Grebennikov | H04B 1/18 455/150.1 |
| 2014/0105343 | A1* | 4/2014 | Mayer | H03C 3/0975 375/371 |
| 2017/0307762 | A1 | 10/2017 | Nakajima et al. | |

* cited by examiner

APPARATUS AND METHOD FOR GENERATING AN OSCILLATION SIGNAL, MOBILE COMMUNICATION SYSTEMS AND MOBILE DEVICE

FIELD

The present disclosure relates to generating (synthesizing) oscillation signals. In particular, examples relate to an apparatus and a method for generating an oscillation signal, mobile communication systems and a mobile device.

BACKGROUND

Conventionally, a dedicated Phase-Locked Loop (PLL) is used for each local oscillator signal to be generated concurrently. A dedicated Radio Frequency (RF) oscillator is required for each local oscillator. This costs a lot of area. Further, the utilization of a LC tank as Digital Controlled Oscillator (DCO) in the PLL makes the system prone to electromagnetic coupling if multiple PLLs are operated simultaneously. If two-point modulation is used for the PLL, precise delay and gain matching is problematic.

Hence, there may be a desire for an improved oscillation signal generation architecture.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
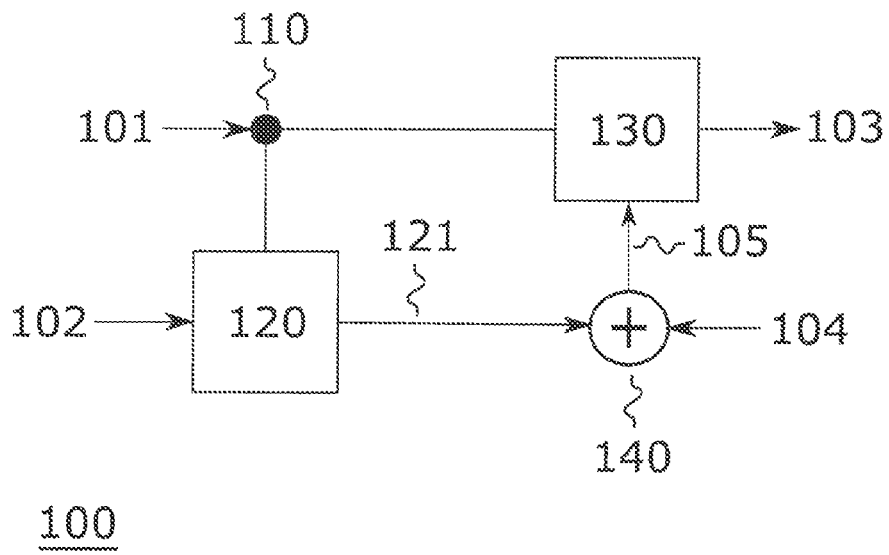
FIG. 1 illustrates a first example of an apparatus for generating an oscillation signal.

FIG. 1 illustrates an apparatus 100 for generating an oscillation signal 103. The apparatus 100 comprises an input 110 configured to receive a first reference oscillation signal 101. Further, the apparatus 100 comprises a phase detector circuit 120 configured to determine a phase drift 121 of the first reference oscillation signal 101 with respect to a second reference oscillation signal 102. The phase drift 121 of the first reference oscillation signal 101 with respect to a second reference oscillation signal 102 denotes the phase change over time of the first reference oscillation signal 101 compared to the second reference oscillation signal 102.

The apparatus 100 additionally comprises a phase shifter circuit 130 configured to generate the oscillation signal 103 based on the first reference oscillation signal 101 and a control signal 105. The control signal 105 controls the modification of signal edge positions in the first reference oscillation signal 101 by the phase shifter circuit 130 in order to modify a phase and/or a frequency of the first reference oscillation signal 101. The modified first reference oscillation signal is output as the oscillation signal 103 by the phase shifter circuit 130. In some examples, not the first reference oscillation signal 101 itself but a signal derived from the first reference oscillation signal 101 (e.g. exhibiting a lower frequency) is modified by the phase shifter circuit 130 based on the control signal 105. The control signal 105 is based on the phase drift 121 and a frequency control signal 104 comprising control data for the phase shifter circuit 130 for adjusting a frequency of the oscillation signal 103 to a desired frequency.

FIG. 1 illustrates a combiner circuit 140 in order to visualize that the control signal 105 is based on the phase drift 121 and the frequency control signal 104. However, it is to be noted that instead of the determined phase drift 121 itself also a signal derived from the phase drift 121 may be combined with the frequency control signal 104 for generating the control signal 105.

The apparatus 100 may allow to extend an oscillator providing the first reference oscillation signal 101 with a feedforward controlled phase shifter and phase detection. This may allow phase and frequency error cancellation as well as generation of additional frequencies for the oscillation signal 103. Furthermore, the second reference oscillation signal 102 may allow synchronization of the apparatus 100 without the need of a PLL, which requires an area- and power-expensive DCO structure.

Figure 2:
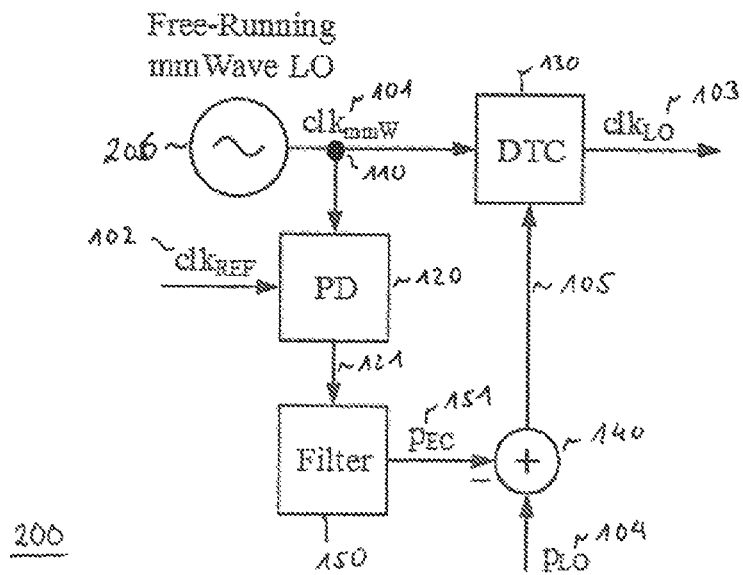
FIG. 2 illustrates a second example of an apparatus for generating an oscillation signal.

As said above, the control signal 105 may be generated by combining the frequency control signal 104 with a signal derived from the phase drift 121. An according apparatus 200 for generating the oscillation signal 103 is illustrated in FIG. 2. In comparison to the apparatus 100 illustrated in FIG. 1, the apparatus 200 additionally comprises a filter circuit 150 configured to generate a phase error signal 151 based on the phase drift 121. The signal combiner circuit 140 is accordingly configured to combine the phase error signal 151 and the frequency control signal 104 to the control signal 105.

The filter circuit 150 may be used for modifying, shaping or reducing the phase noise in the oscillation signal 103 by shaping the phase drift 121 (see below description of FIGS. 6 to 8). For example, the filter circuit 150 may exhibit a low-pass filter characteristic or a notch filter characteristic.

As indicated in FIG. 2, the phase shifter circuit 130 may be a Digital-to-Time Converter (DTC).

Further illustrated in FIG. 2 is oscillator 206 for generating the first reference oscillation signal 101. The oscillator 206 may, e.g., be a free running oscillator. A free running oscillator is an oscillator that is running (operating) without a reference. The oscillator 206 may in some examples be implemented as a single oscillator. In other examples, several oscillators may be used for the oscillator 206 and their oscillation signals may be combined (e.g. averaged) to the first reference oscillation signal 101. The oscillator 206 may exhibit a high quality factor so that the first reference oscillation signal 101 exhibits low phase noise. In other words, the oscillator 206 may be a high-Q oscillator. The frequency of the first reference oscillation signal 101 may be any frequency. In some examples, the frequency of the first reference oscillation signal may exceed 5, 10, 15, 20 or 25 GHz. That is, oscillator 206 may in some examples be a millimeter-wave RF oscillator.

FIG. 2 illustrates the proposed oscillation signal generator in a configuration in which the free-running high-Q millimeter-wave RF oscillator 206 generates the unmodulated carrier signal 101 supplied to the DTC 130.

The phase detector 120 is utilized to measure the drifting of the free-running oscillator 206 in phase and frequency compared to the (common) reference clock signal 102. The phase error 121 is further shaped in a subsequent (digital) low-pass filter structure 150 generating the phase error cancellation signal 151. The DTC 130 shifts the phase of the millimeter-wave signal 101 depending on the cancellation signal 151 and the desired carrier frequency that is indicated by the phase ramp signal 104.

The noise and phase drift introduced by the free running oscillator 206 is cancelled by the feedforward subtraction. The delay in the cancellation path, which is dominated by the filter group delay, may limit the cancellation gain. For example, the cancellation gain may start with 0 dB below the filter cutoff frequency and evolve with −20 dB/decade times the filter order towards higher frequencies. In other words, the filter 150 may resemble a low-pass filter behavior.

Figure 3:
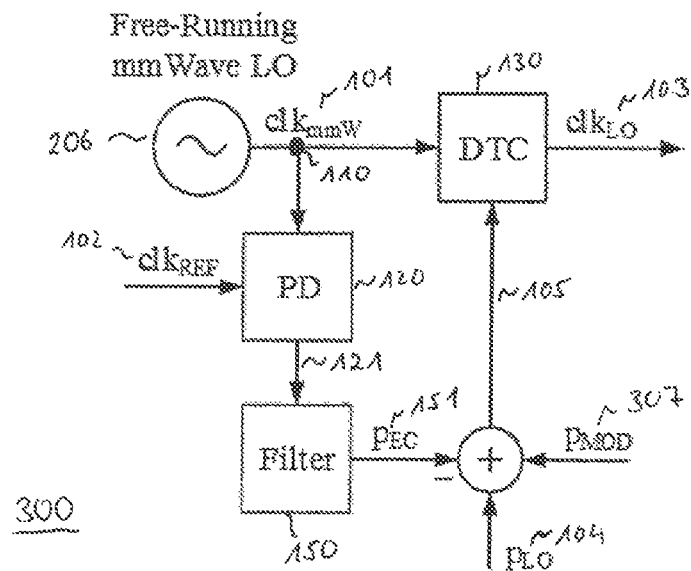
FIG. 3 illustrates a third example of an apparatus for generating an oscillation signal.

FIG. 3 illustrates another apparatus 300 for generating the oscillation signal 103. In comparison to the apparatus 200 illustrated in FIG. 2, the apparatus 300 further allows phase modulation of the oscillation signal 103. In particular, the control signal 105 is further based on a modulation control signal 307 comprising control data for the phase shifter circuit 130 for adjusting a phase of the oscillation signal 103 according to a desired phase modulation. As indicated in FIG. 3, the signal combiner circuit 140 may be configured to combine the phase error signal 151, the frequency control signal 104 and the modulation control signal 307 to the control signal 105.

The additional phase modulation of the oscillation signal 103 may, e.g., be beneficial when using the apparatus 300 in a transmitter or a transceiver for RF transmit signal generation. The DTC 130 shifts the phase of the carrier signal 101 depending on the digital input 105 which is the sum of the phase modulation 307, the ideal LO phase ramp 104 and the cancellation signal 151. The proposed feedforward control may allow to avoid using conventional feedback-loops with two-point modulation. Accordingly, the delay and gain matching problems of the two-point modulation may be avoided.

Figure 4:
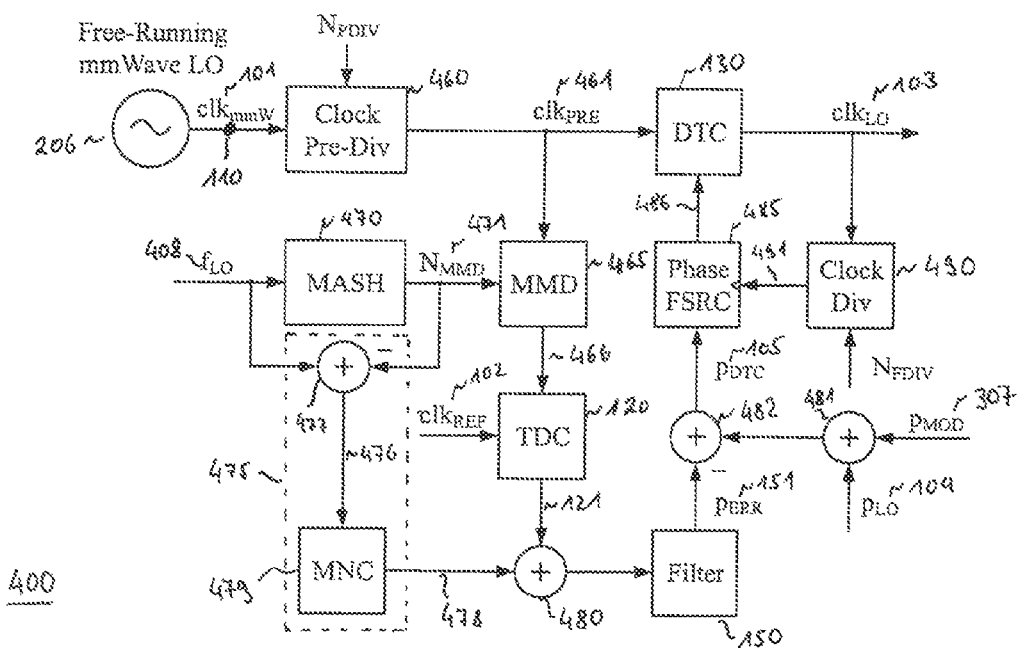
FIG. 4 illustrates a fourth example of an apparatus for generating an oscillation signal.

FIG. 4 illustrates a more detailed structure of a phase modulator according to the proposed architecture.

The apparatus 400 illustrated in FIG. 4 comprises an input 110 for receiving the first reference oscillation signal 101 from the oscillator 206. Before comparing the first reference oscillation signal 101 to the second reference oscillation signal 102, the first reference oscillation signal 101 is frequency divided in order to enable signal processing at lower rate. Therefore, a first frequency divider circuit 460 is coupled between the input 110 and the phase shifter circuit 130 (e.g. a DTC). The first frequency divider circuit 460 is configured to generate a third reference oscillation signal 461 based on the first reference oscillation signal 101 (and a divider control word $N_{PDIV}$). The frequency of the third reference oscillation signal 461 is lower than the frequency of the first reference oscillation signal 101.

The example of FIG. 4 uses a Multi-Modulus Divider (MMD) circuit 465 to allow fractional division of the oscillator signal for phase detection with a Time-to-Digital Converter (TDC). The MMD circuit 465 is configured to generate a fourth reference oscillation signal 466 based on the third reference oscillation signal 461 and a divider control word 471. The frequency of the fourth reference oscillation signal 466 is lower than the frequency of the third reference oscillation signal 461. The TDC used as phase detector 120 is configured to determine the phase drift 121 by comparing the fourth reference oscillation signal 466 to the second reference oscillation signal 102. The frequency of the second reference oscillation signal 102 is lower than the frequency of the first reference oscillation signal 101.

The apparatus 400 further comprises a multi-stage noise shaping (MASH) sigma-delta modulator circuit 470 configured to generate the divider control word 471 based on a frequency control word 408. The frequency control word 408 is based on the frequency control signal 104. For example, the frequency control word 408 may be derived from the frequency control signal 104.

Further, the apparatus 400 comprises a quantization noise cancellation circuit 475 for mitigating (reducing) quantization noise introduced by the MASH sigma-delta modulator circuit 470. The quantization noise cancellation circuit 475 is configured to determine a quantization error 476 of the divider control word 471 with respect to the frequency control word 408. As indicated in FIG. 4, the cancellation circuit 475 may, e.g., comprise a subtractor circuit 477 configured to determine the quantization error 476 by subtracting the divider control word 471 and the frequency control word 408 from each other. The quantization noise cancellation circuit 475 is further configured to generate a quantization noise cancellation signal 478 based on the quantization error 476. For example, the cancellation circuit 475 may comprises a MASH Noise Cancellation (MNC) circuit 479 configured to noise-shape the quantization error 476 for generating the quantization noise cancellation signal 478.

The quantization noise cancellation signal 478 and the phase drift 121 are subsequently combined by combiner circuit 480 and input to the filter circuit 150. Accordingly, the filter circuit 150 generates the phase error signal 151 based on the phase error signal 121 and the quantization noise cancellation signal 478.

In other words, the MMD 465 is fed by the MASH sigma-delta modulator circuit 471 and the quantization noise is cancelled digitally after the TDC 120.

The phase error signal 151 is subsequently combined with the frequency control signal 104 and the modulation control signal 307 to the control signal 105 by means of the signal combiner circuit 481 and 482.

For enabling high frequencies of the oscillation signal 103, the sample rate of the control signal 105 is adapted to the desired frequency of the oscillation signal 103. Therefore, the apparatus 400 comprises a sample rate converter circuit 485 (e.g. a Fractional Sample Rate Converter, FSRC) configured to upsample the control signal 105 based on a sample rate control signal 491 derived from the oscillation signal 103. A second frequency divider circuit 490 is configured to generate the sample rate control signal 491 by frequency dividing the oscillation signal 103 using divider control word $N_{FDIV}$.

The phase shifter circuit 130 (here a DTC) receives the upsampled control signal 486 and the third reference oscillation signal 461 for generating the oscillation signal 103. In other words, the combined phase shift signal 105 is upsampled to a clock rate derived from the oscillation signal 103 using a FSRC.

By reducing the clock rate for the feedforward loop, a power consumption of the apparatus 400 may be reduced. Further, when using a high frequency oscillation signal for the first reference oscillation signal 101 (e.g. exhibiting a frequency of 25 GHz or more), reducing the clock rate may allow to use a DTC for the phase shifter circuit and a TDC for the phase detector since the frequency of the first reference oscillation signal 101 may be reduced to clock rates processible by the DTC and TDC.

Figure 5:
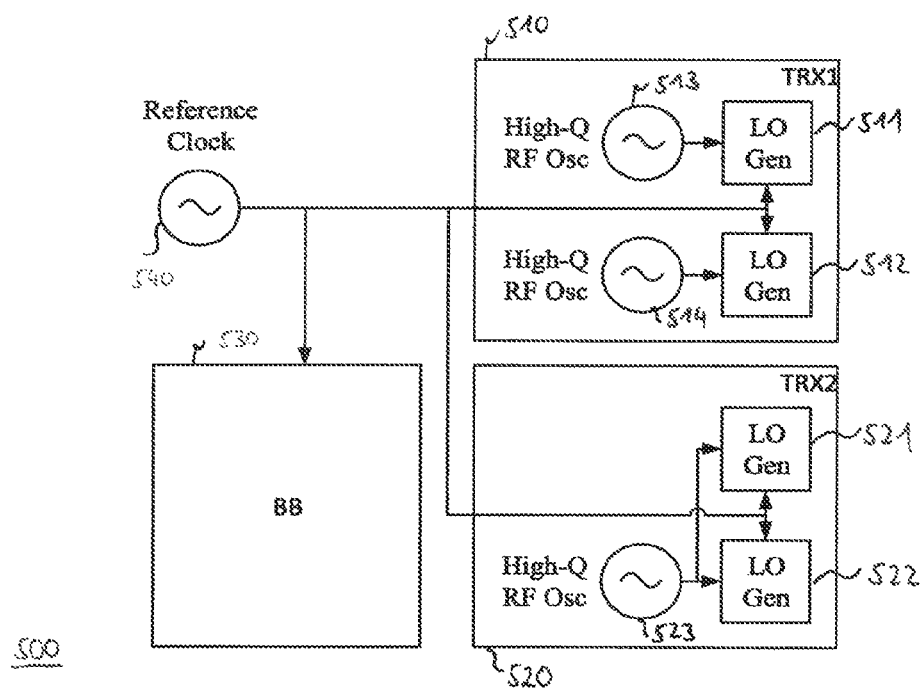
FIG. 5 illustrates an example of a mobile communication system.

FIG. 5 further illustrates a mobile communication system 500 using oscillation signal generation according to the proposed architecture. The system 500 comprises two transceivers 510, 520 and a baseband chip 530 which are synchronized by a common reference clock 540. However, it is to be noted that the transceivers 510 and 520 are merely examples for communication circuitry. In some examples, the transceivers 510 and 520 may alternatively be transmitters or receivers.

The transceiver 510 comprises a first apparatus 511 for generating an oscillation signal according to the proposed architecture. Further, the transceiver 510 comprises a second apparatus 512 for generating an oscillation signal according to the proposed architecture. The transceiver comprises a first oscillator 513 coupled to the first apparatus 511 and configured to generate the first reference oscillation signal for the first apparatus 511. Similarly, the transceiver comprises a second oscillator 514 coupled to the second apparatus 512 and configured to generate the first reference oscillation signal for the second apparatus 512. For example, the first oscillator 513 and/or the second oscillator 514 may be free running oscillators.

The transceiver 520 comprises a first apparatus 521 for generating an oscillation signal according to the proposed architecture. Further, the transceiver 520 comprises a second apparatus 522 for generating an oscillation signal according to the proposed architecture. The transceiver comprises an oscillator 523 coupled to the first apparatus 521 and the second apparatus 521. The oscillator 523 is configured to generate the first reference oscillation signal for both the first apparatus 521 and the second apparatus 522.

The reference oscillator 540 of the mobile communication system 500 is coupled to the first apparatuses 511, 521 and the second apparatuses 512, 522 of both transceivers 510 and 520. The reference oscillator 540 generates the second reference oscillation signal for the first apparatuses 511, 521 and the second apparatuses 512, 522 of both transceivers 510 and 520.

As indicated in FIG. 5, a transceiver can either employ a shared High-Q RF oscillator or implement multiples of them which are all synced using the proposed feedforward phase error cancellation method.

Also the data exchange of the baseband processor 530 with the transceivers 510 and 520 is synchronized by the second reference oscillation signal which is provided by the reference oscillator 540.

The proposed oscillation signal generation architecture may allow to extend the High-Q RF oscillator(s) with a feedforward controlled phase shifter (e.g. DTC) and phase detection in order to allow phase and frequency error cancellation, generation of additional frequencies as well as phase modulation with minimal complexity. The proposed feedforward phase and frequency error cancellation for a free-running oscillator with subsequent a DTC may, e.g., be used for generating a phase modulated RF carrier for a polar transmit signal or for synchronization between multiple, parallel receive and transmit chains. The free-running oscillator phase drift/noise is measured by the phase detector with subsequent filtering and then subtracted in the modulation path of the DTC.

Synchronization of the proposed oscillation signal generators, which are part of the RF chains, may be ensured without the need of a PLL. By avoiding the mismatch sensitive two-point modulation of a PLL system, a wideband phase modulation of the DTC with a free-running LO becomes feasible. This may enable polar transmit chains for wideband modulation applications such as $5^{th}$ Generation New Radio (5G NR) or Long-Term Evolution (LTE) in combination with low-cost, low-power and low-area on-chip clock generation. If the High-Q RF oscillator(s) are not impacted by electromagnetic coupling, the complexity of crosstalk may be further reduced.

In the following, the impact of the settings for the filter circuit 150 on the phase noise of the oscillation signal 103 are discussed in connection with FIG. 6 to 8. A time domain model including a free-running resonator, a DTC and the proposed feedforward phase noise cancellation is used as a basis for the exemplary noise plots of FIGS. 6 to 8. The filter circuit 150 is assumed to be a low-pass filter.

Figure 6:
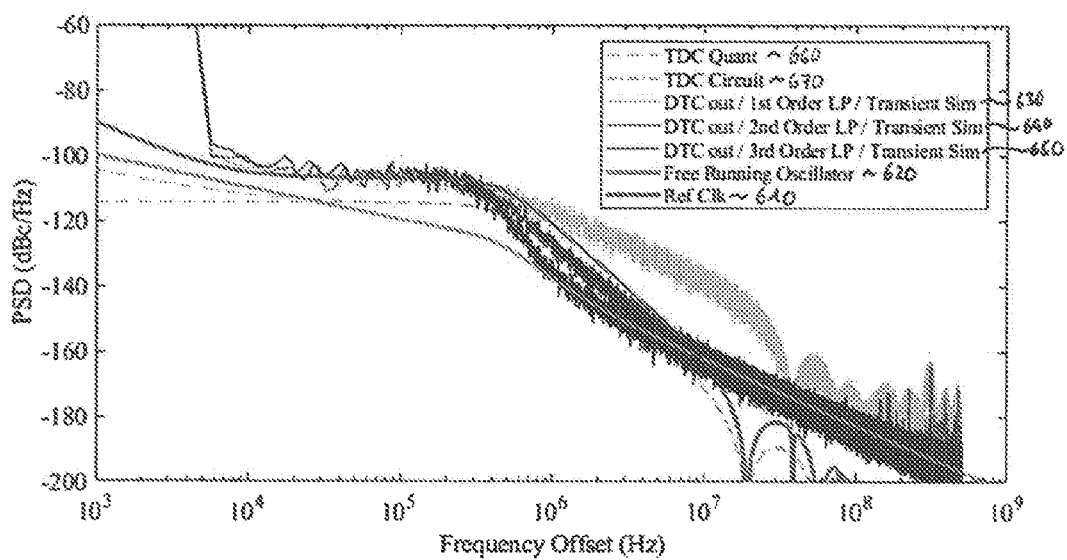
FIG. 6 illustrates a first example of a phase noise plot.

FIG. 6 illustrates the phase noise of the oscillation signal 103 for different low-pass filter orders. It can be seen from curves 630, 640 and 650 (representing the phase noise of the oscillation signal 103 for ascending filer orders) that the feedforward phase noise cancellation limits the close-in phase noise of the oscillation signal 103 (i.e. the DTC output) to the dominating reference clock phase noise level (curve 610). The far-off phase noise is limited by the free-running oscillator phase noise (curve 620). The transition between both regions originates at the low-pass filter cut-off frequency as part of the feedforward phase noise cancellation circuitry. It can further be seen from curves 630, 640 and 650 that the cancellation is improved with higher low-pass filter orders.

As a reference, curves 660 and 670 further represent the TDC quantization noise and the TDC noise.

Figure 7:
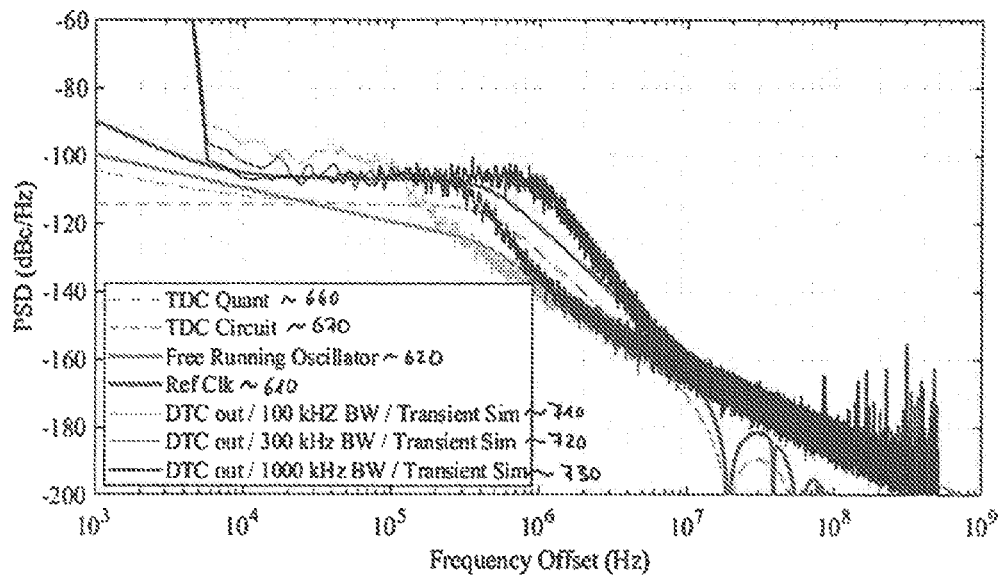
FIG. 7 illustrates a second example of a phase noise plot.

The phase noise for different low-pass filter cut-off frequencies is illustrated in FIG. 7 by means of curves 710, 720 and 730 (representing the phase noise of the oscillation signal 103 for increasing filter bandwidth). The cut-off frequency can be chosen according to the phase noise requirements, however at lower cut-off frequencies (see curve 710) the higher group delay of the filter already starts to reduce the cancellation gain.

Figure 8:
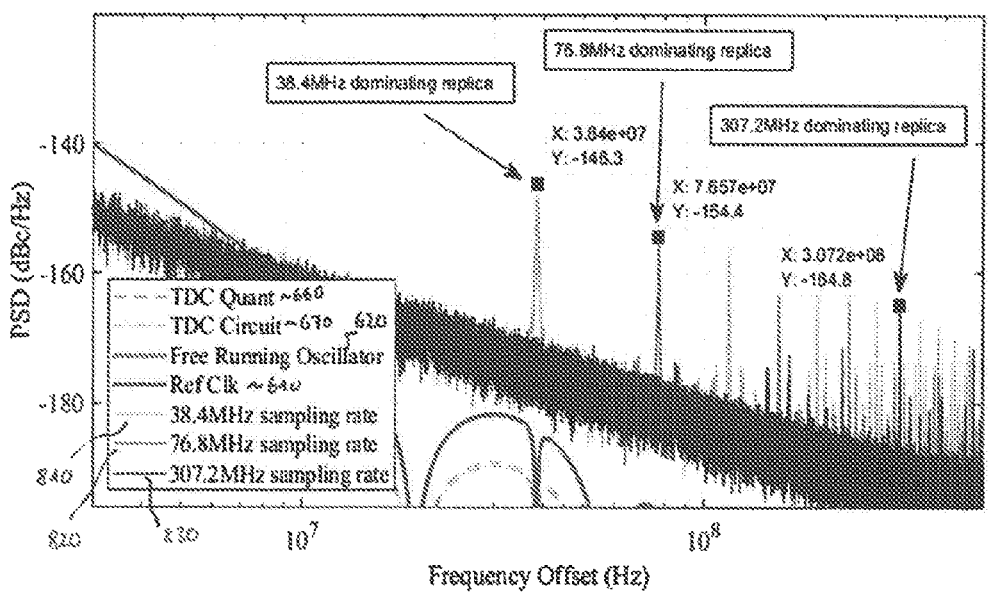
FIG. 8 illustrates a third example of a phase noise plot.

The phase noise for different low-pass filter sampling rates is illustrated in FIG. 8 by means of curves 810, 820 and 830 (representing the phase noise of the oscillation signal 103 for increasing sampling rates). Due to the digital cancellation, spectral replicas originate at multiples of the filter sampling frequency. It can be seen from FIG. 8 that the effect can be countered with an upconversion of the phase error sampling rate and subsequent low-pass filtering.

Figure 9:
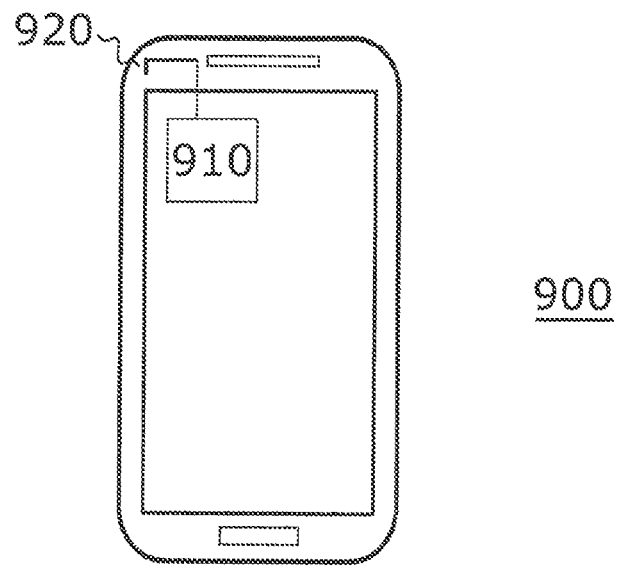
FIG. 9 illustrates an example of a mobile device comprising a mobile communication system.

An example of an implementation using oscillation signal generation according to one or more aspects of the proposed technique or one or more examples described above is illustrated in FIG. 9. FIG. 9 schematically illustrates an example of a mobile device 900 (e.g mobile phone, smart-phone, tablet-computer, or laptop) comprising at least one mobile communication system 910 according to an example described herein. The mobile communication system 910 is coupled to at least one antenna element 920 for radiating a RF signal generated by the mobile communication system 910 to the environment and/or for receiving a RF signal from the environment and providing it to the mobile communication system 910.

The mobile device 900 may comprise further elements such as, e.g., an application processor, memory, an audio driver, a camera driver, a touch screen, a display driver, sensors, removable memory, a power management integrated circuit or a smart battery.

To this end, a mobile device enabling low-cost, low-power and low-area on-chip clock generation may be provided. Moreover, a synchronization between several transmit and receive chains for, e.g., receive-diversity, Multiple-Input Multiple-Output (MIMO) and carrier aggregation features in 4G LTE and 5G NR may be enabled by the proposed architecture. This is for example of importance for self-interference cancellation (SIC) or for Automatic Frequency Control (AFC) which require a synchronization of the transmit and receive chains.

The above wireless communication circuits using oscillation signal generation according to the proposed technique or one or more of the examples described above may be configured to operate according to one of the $3^{rd}$ Generation Partnership Project (3GPP)-standardized mobile communication networks or systems. The mobile or wireless communication system may correspond to, for example, a 5G NR, a LTE, an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

Figure 10:
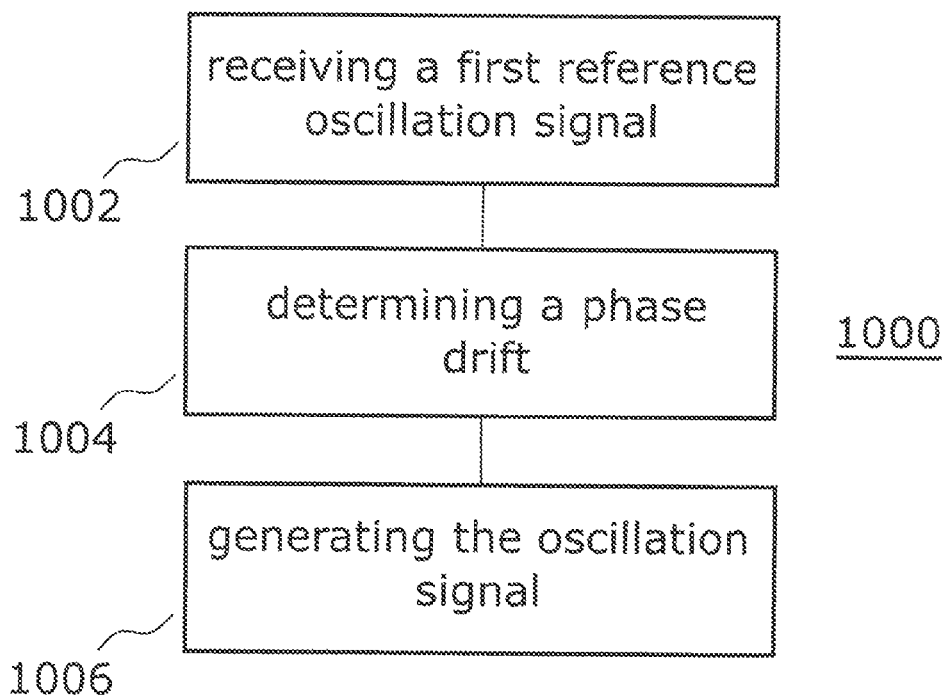
FIG. 10 illustrates a flowchart of an example of a method for generating an oscillation signal.

An example of a method 1000 for generating an oscillation signal is illustrated by means of a flowchart in FIG. 10. The method 1000 comprises receiving 1002 a first reference oscillation signal, and determining 1004 a phase drift of the first reference oscillation signal with respect to a second reference oscillation signal. Further, the method 1000 comprises generating 1006 the oscillation signal based on the first reference oscillation signal and a control signal using a phase shifter circuit. The control signal is based on the phase drift and a frequency control signal comprising control data for the phase shifter circuit for adjusting a frequency of the oscillation signal to a desired frequency.

More details and aspects of the method are mentioned in connection with the proposed technique or one or more examples described above (e.g. FIGS. 1 to 5). The method may comprise one or more additional optional features corresponding to one or more aspects of the proposed technique or one or more examples described above.

The examples as described herein may be summarized as follows:

Example 1 is an apparatus for generating an oscillation signal, comprising: an input configured to receive a first reference oscillation signal; a phase detector circuit configured to determine a phase drift of the first reference oscillation signal with respect to a second reference oscillation signal; and a phase shifter circuit configured to generate the oscillation signal based on the first reference oscillation signal and a control signal, wherein the control signal is based on the phase drift and a frequency control signal comprising control data for the phase shifter circuit for adjusting a frequency of the oscillation signal to a desired frequency.

Example 2 is the apparatus of example 1, wherein the control signal is further based on a modulation control signal comprising control data for the phase shifter circuit for adjusting a phase of the oscillation signal according to a desired phase modulation.

Example 3 is the apparatus of example 1 or example 2, further comprising: a filter circuit configured to generate a phase error signal based on the phase drift; and a signal combiner circuit configured to combine the phase error signal and the frequency control signal to the control signal.

Example 4 is the apparatus of example 3, further comprising a first frequency divider circuit coupled between the input and the phase shifter circuit, wherein the first frequency divider circuit is configured to generate a third reference oscillation signal based on the first reference oscillation signal, wherein a frequency of the third reference oscillation signal is lower than a frequency of the first reference oscillation signal.

Example 5 is the apparatus of example 4, further comprising a multi-modulus divider circuit configured to generate a fourth reference oscillation signal based on the third reference oscillation signal and a divider control word, wherein a frequency of the fourth reference oscillation signal is lower than a frequency of the third reference oscillation signal, and wherein the phase detector is configured to determine the phase drift by comparing the fourth reference oscillation signal to the second reference oscillation signal.

Example 6 is the apparatus of example 5, further comprising a multi-stage noise shaping sigma-delta modulator circuit configured to generate the divider control word based on a frequency control word, wherein the frequency control word is based on the frequency control signal.

Example 7 is the apparatus of example 6, further comprising a quantization noise cancellation circuit configured to determine a quantization error of the divider control word with respect to the frequency control word, wherein the quantization noise cancellation circuit is further configured to generate a quantization noise cancellation signal based on the quantization error, and wherein the filter circuit is further configured to generate the phase error signal based on the quantization noise cancellation signal.

Example 8 is the apparatus of any of examples 4 to 7, further comprising a sample rate converter circuit configured to upsample the control signal based on a sample rate control signal, wherein the phase shifter circuit is configured to receive the upsampled control signal and the third reference oscillation signal for generating the oscillation signal, and wherein the sample rate control signal is derived from the oscillation signal.

Example 9 is the apparatus of example 8, further comprising a second frequency divider configured to generate the sample rate control signal by frequency dividing the oscillation signal.

Example 10 is the apparatus of any of examples 1 to 9, wherein the phase detector circuit is a time-to-digital converter.

Example 11 is the apparatus of any of examples 1 to 10, wherein the phase shifter circuit is a digital-to-time converter.

Example 12 is the apparatus of any of examples 1 to 11, wherein a frequency of the second reference oscillation signal is lower than a frequency of the first reference oscillation signal.

Example 13 is the apparatus of any of examples 1 to 12, wherein a frequency of the first reference oscillation signal exceeds 25 GHz.

Example 14 is a mobile communication system, comprising: a first apparatus for generating an oscillation signal according to any of examples 1 to 13; a second apparatus for generating an oscillation signal according to any of examples 1 to 13; a first oscillator coupled to the first apparatus and configured to generate the first reference oscillation signal for the first apparatus; a second oscillator coupled to the second apparatus and configured to generate the first reference oscillation signal for the second apparatus; and a reference oscillator coupled to the first apparatus and the second apparatus, wherein the reference oscillator is configured to generate the second reference oscillation signal for the first apparatus and the second apparatus.

Example 15 is the mobile communication system of example 14, further comprising one of a transmitter, a receiver and a transceiver, wherein the one of the transmitter, the receiver and the transceiver comprises the first apparatus and the second apparatus.

Example 16 is the mobile communication system of example 14 or example 15, further comprising a baseband processor configured to exchange data with the one of the transmitter, the receiver and the transceiver, wherein the baseband processor and the one of the transmitter, the receiver and the transceiver are synchronized by the second reference oscillation signal.

Example 17 is the mobile communication system of any of examples 14 to 16, wherein at least one of the first oscillator and the second oscillator is a free running oscillator.

Example 18 is a mobile communication system, comprising: a first apparatus for generating an oscillation signal according to any of examples 1 to 13; a second apparatus for generating an oscillation signal according to any of examples 1 to 13; an oscillator coupled to the first apparatus and the second apparatus and configured to generate the first reference oscillation signal for the first apparatus and the second apparatus; and a reference oscillator coupled to the first apparatus and the second apparatus, wherein the reference oscillator is configured to generate the second reference oscillation signal for the first apparatus and the second apparatus.

Example 19 is the mobile communication system of example 18, further comprising one of a transmitter, a receiver and a transceiver, wherein the one of the transmitter, the receiver and the transceiver comprises the first apparatus and the second apparatus.

Example 20 is the mobile communication system of example 18 or example 19, further comprising a baseband processor configured to exchange data with the one of the transmitter, the receiver and the transceiver, wherein the baseband processor and the one of the transmitter, the receiver and the transceiver are synchronized by the second reference oscillation signal.

Example 21 is the mobile communication system of any of examples 18 to 20, wherein the oscillator is a free running oscillator.

Example 22 is a mobile device comprising a first mobile communication system according to any of examples 14 to 17 and/or a second mobile communication system according to any of examples 18 and 21.

Example 23 is the mobile device of example 22, further comprising at least one antenna element coupled to the first mobile communication system and/or the second mobile communication system.

Example 24 is a method for generating an oscillation signal, comprising:
receiving a first reference oscillation signal;
determining a phase drift of the first reference oscillation signal with respect to a second reference oscillation signal; and
generating the oscillation signal based on the first reference oscillation signal and a control signal using a phase shifter circuit, wherein the control signal is based on the phase drift and a frequency control signal comprising control data for the phase shifter circuit for adjusting a frequency of the oscillation signal to a desired frequency.

Example 25 is the method of example 24, wherein the control signal is further based on a modulation control signal comprising control data for the phase shifter circuit for adjusting a phase of the of the oscillation signal according to a desired phase modulation.

Example 26 is the method of example 24 or example 25, wherein a frequency of the second reference oscillation signal is lower than a frequency of the first reference oscillation signal.

Example 27 is the method of any of examples 24 to 26, wherein a frequency of the first reference oscillation signal exceeds 25 GHz.

Example 28 is the method of any of examples 24 to 27, wherein the phase shifter circuit is a digital-to-time converter.

The proposed architecture may enable a DTC based oscillation signal generator with feedforward phase error cancellation and free running local oscillator. Compared to conventional approaches, the proposed architecture may use an integrated high-Q oscillator instead of a DPLL with an LC-Tank RF oscillator. Also a DTC may be found visually in the RF LO path. The system may additionally allow to use a common external reference. When measuring the lower frequency region of the phase noise spectrum of the oscillation signal (e.g. via leakage at RF ports), the shape of the phase noise may reveal that low frequency phase noise cancellation according to the proposed architecture is used.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for generating an oscillation signal, comprising:
    an input configured to receive a first reference oscillation signal;
    a phase detector circuit configured to determine a phase drift of the first reference oscillation signal with respect to a second reference oscillation signal;
    a phase shifter circuit configured to generate the oscillation signal based on the first reference oscillation signal and a control signal,
        wherein the control signal is based on the phase drift and a frequency control signal comprising control data for the phase shifter circuit for adjusting a frequency of the oscillation signal to a desired frequency; a filter circuit configured to generate a phase error signal based on the phase drift;
    a signal combiner circuit configured to combine the phase error signal and the frequency control signal to the control signal;
    a first frequency divider circuit coupled between the input and the phase shifter circuit,
        wherein the first frequency divider circuit is configured to generate a third reference oscillation signal based on the first reference oscillation signal,
        wherein a frequency of the third reference oscillation signal is lower than a frequency of the first reference oscillation signal;
    a multi-modulus divider circuit configured to generate a fourth reference oscillation signal based on the third reference oscillation signal and a divider control word,
        wherein a frequency of the fourth reference oscillation signal is lower than a frequency of the third reference oscillation signal,
        wherein the phase detector is configured to determine the phase drift by comparing the fourth reference oscillation signal to the second reference oscillation signal; and
    a multi-stage noise shaping sigma-delta modulator circuit configured to generate the divider control word based on a frequency control word,
        wherein the frequency control word is based on the frequency control signal.

2. The apparatus of claim 1, wherein the control signal is further based on a modulation control signal comprising control data for the phase shifter circuit for adjusting a phase of the oscillation signal according to a desired phase modulation.

3. The apparatus of claim 1, further comprising a quantization noise cancellation circuit configured to determine a quantization error of the divider control word with respect to the frequency control word, wherein the quantization noise cancellation circuit is further configured to generate a quantization noise cancellation signal based on the quantization error, and wherein the filter circuit is further configured to generate the phase error signal based on the quantization noise cancellation signal.

4. The apparatus of claim 1, further comprising a sample rate converter circuit configured to upsample the control signal based on a sample rate control signal, wherein the phase shifter circuit is configured to receive the upsampled control signal and the third reference oscillation signal for generating the oscillation signal, and wherein the sample rate control signal is derived from the oscillation signal.

5. The apparatus of claim 4, further comprising a second frequency divider configured to generate the sample rate control signal by frequency dividing the oscillation signal.

6. The apparatus of claim 1, wherein the phase detector circuit is a time-to-digital converter.

7. The apparatus of claim 1, wherein the phase shifter circuit is a digital-to-time converter.

8. The apparatus of claim 1, wherein a frequency of the second reference oscillation signal is lower than a frequency of the first reference oscillation signal.

9. The apparatus of claim 1, wherein a frequency of the first reference oscillation signal exceeds 25 GHz.

10. A mobile communication system, comprising:
a first and a second apparatus for generating an oscillation signal, the first and the second apparatus, comprising:
an input configured to receive a first reference oscillation signal;
a phase detector circuit configured to determine a phase drift of the first reference oscillation signal with respect to a second reference oscillation signal; and
a phase shifter circuit configured to generate the oscillation signal based on the first reference oscillation signal and a control signal,
wherein the control signal is based on the phase drift and a frequency control signal comprising control data for the phase shifter circuit for adjusting a frequency of the oscillation signal to a desired frequency;
a first oscillator coupled to the first apparatus and configured to generate the first reference oscillation signal for the first apparatus;
a second oscillator coupled to the second apparatus and configured to generate the first reference oscillation signal for the second apparatus; and
a reference oscillator coupled to the first apparatus and the second apparatus, wherein the reference oscillator is configured to generate the second reference oscillation signal for the first apparatus and the second apparatus.

11. The mobile communication system of claim 10, further comprising one of a transmitter, a receiver and a transceiver, wherein the one of the transmitter, the receiver and the transceiver comprises the first apparatus and the second apparatus.

12. The mobile communication system of claim 10, further comprising a baseband processor configured to exchange data with the one of the transmitter, the receiver and the transceiver, wherein the baseband processor and the one of the transmitter, the receiver and the transceiver are synchronized by the second reference oscillation signal.

13. The mobile communication system of claim 10, wherein at least one of the first oscillator and the second oscillator is a free running oscillator.

14. A mobile communication system, comprising:
a first and a second apparatus for generating an oscillation signal, the first and the second apparatus, comprising:
an input configured to receive a first reference oscillation signal;
a phase detector circuit configured to determine a phase drift of the first reference oscillation signal with respect to a second reference oscillation signal; and
a phase shifter circuit configured to generate the oscillation signal based on the first reference oscillation signal and a control signal,
wherein the control signal is based on the phase drift and a frequency control signal comprising control data for the phase shifter circuit for adjusting a frequency of the oscillation signal to a desired frequency;
an oscillator coupled to the first apparatus and the second apparatus and configured to generate the first reference oscillation signal for the first apparatus and the second apparatus; and
a reference oscillator coupled to the first apparatus and the second apparatus, wherein the reference oscillator is configured to generate the second reference oscillation signal for the first apparatus and the second apparatus.

15. The mobile communication system of claim 14, further comprising one of a transmitter, a receiver and a transceiver, wherein the one of the transmitter, the receiver and the transceiver comprises the first apparatus and the second apparatus.

16. The mobile communication system of claim 14, further comprising a baseband processor configured to exchange data with the one of the transmitter, the receiver and the transceiver, wherein the baseband processor and the one of the transmitter, the receiver and the transceiver are synchronized by the second reference oscillation signal.

17. The mobile communication system of claim 14, wherein the oscillator is a free running oscillator.

18. A method for generating an oscillation signal, comprising:
receiving a first reference oscillation signal;
determining a phase drift of the first reference oscillation signal with respect to a second reference oscillation signal;
generating the oscillation signal based on the first reference oscillation signal and a control signal using a phase shifter circuit,
wherein the control signal is based on the phase drift and a frequency control signal comprising control data for the phase shifter circuit for adjusting a frequency of the oscillation signal to a desired frequency;
generating a phase error signal based on the phase drift using a filter circuit using a filter circuit;
combining the phase error signal and the frequency control signal to the control signal using a signal combiner circuit;
generating a third reference oscillation signal based on the first reference oscillation signal using a first frequency divider circuit,
wherein the first frequency divider circuit is coupled between the input and the phase shifter circuit,
wherein a frequency of the third reference oscillation signal is lower than a frequency of the first reference oscillation signal;
generating a fourth reference oscillation signal based on the third reference oscillation signal and a divider control word using a multi-modulus divider circuit,
wherein a frequency of the fourth reference oscillation signal is lower than a frequency of the third reference oscillation signal,
wherein the phase detector is configured to determine the phase drift by comparing the fourth reference oscillation signal to the second reference oscillation signal; and
generating the divider control word based on a frequency control word using a multi-stage noise shaping sigma-delta modulator circuit,
wherein the frequency control word is based on the frequency control signal.

19. The method of claim 18, wherein the control signal is further based on a modulation control signal comprising control data for the phase shifter circuit for adjusting a phase of the of the oscillation signal according to a desired phase modulation.

20. The method of claim 18, wherein a frequency of the second reference oscillation signal is lower than a frequency of the first reference oscillation signal.

21. The method of claim 18, wherein a frequency of the first reference oscillation signal exceeds 25 GHz.

* * * * *